US008564196B2

(12) United States Patent
Okumoto et al.

(10) Patent No.: US 8,564,196 B2
(45) Date of Patent: Oct. 22, 2013

(54) ORGANIC ELECTROLUMINESCENT DISPLAY DEVICE CONTAINING FILTER TO PROVIDE HIGH CONTRAST

(75) Inventors: Kenji Okumoto, Kyoto (JP); Masafumi Matsui, Kyoto (JP); Takashi Ohta, Osaka (JP); Kouhei Koresawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/252,639

(22) Filed: Oct. 4, 2011

(65) Prior Publication Data

US 2012/0025699 A1    Feb. 2, 2012

Related U.S. Application Data

(63) Continuation of application No. PCT/JP2010/002502, filed on Apr. 6, 2010.

(30) Foreign Application Priority Data

Apr. 9, 2009 (JP) ................................. 2009-095244

(51) Int. Cl.
*H01J 1/62* (2006.01)
*H01J 63/04* (2006.01)

(52) U.S. Cl.
USPC ........... 313/506; 313/483; 313/500; 313/501; 313/502; 313/503; 313/504; 313/505

(58) Field of Classification Search
None
See application file for complete search history.

(56) References Cited

U.S. PATENT DOCUMENTS

| 5,777,707 | A | 7/1998 | Masaki et al. |
| 7,456,570 | B2 | 11/2008 | Kawamura et al. |
| 7,567,030 | B2 | 7/2009 | Wano |
| 8,421,065 | B2 * | 4/2013 | Okumoto et al. ............... 257/40 |
| 2005/0248929 | A1 | 11/2005 | Kawamura et al. |
| 2007/0052345 | A1 | 3/2007 | Wano |
| 2007/0194679 | A1 * | 8/2007 | Jo et al. ......................... 313/112 |

FOREIGN PATENT DOCUMENTS

| EP | 0753783 | 1/1997 |
| JP | 61-032802 | 2/1986 |
| JP | 05-002106 | 1/1993 |
| JP | 2003-017263 | 1/2003 |

(Continued)

OTHER PUBLICATIONS

English machine translation of JP 2003-017263 (Sakaeda et al).*

(Continued)

*Primary Examiner* — Natalie Walford
(74) *Attorney, Agent, or Firm* — Greenblum & Bernstein, P.L.C.

(57) ABSTRACT

An organic EL display device including organic EL light-emitting regions which includes a red-light emitting layer, a green-light emitting layer, and a blue-light emitting layer that are arranged on a main substrate includes: a first light-adjusting layer including a first portion and a second portion, the first portion selectively transmitting desired blue light, and the second portion absorbing visible light other than at least the desired blue light; and a second light-adjusting layer selectively absorbing light with a wavelength between desired red light and desired green light at an entire surface, in which the blue light-emitting layer is overlaid with the first portion, and a bank which is a non-light emitting portion is overlaid with the second portion. The first portion and the second portion may be integrally formed of a same material, and the second portion may absorb an entire range of visible light.

21 Claims, 6 Drawing Sheets

(56) References Cited

FOREIGN PATENT DOCUMENTS

| | | |
|---|---|---|
| JP | 2003-173875 | 6/2003 |
| JP | 2003-294932 | 10/2003 |
| JP | 2006-310075 | 11/2006 |
| JP | 2007-095444 | 4/2007 |
| JP | 2007-226239 | 9/2007 |
| JP | 2007-280901 | 10/2007 |
| JP | 2009032576 | 2/2009 |
| KR | 10-2004-0111629 | 12/2004 |
| KR | 10-2007-0026238 | 3/2007 |
| WO | 03/101155 | 12/2003 |

OTHER PUBLICATIONS

International Search Report in PCT/JP2010/002502. mailing date of Jul. 20, 2010.

Korea Office action, mail date is Apr. 3, 2013.

EP Search Report dated Aug. 5, 2013.

\* cited by examiner

ORGANIC ELECTROLUMINESCENT DISPLAY DEVICE CONTAINING FILTER TO PROVIDE HIGH CONTRAST

CROSS REFERENCE TO RELATED APPLICATION

This is a continuation application of PCT application No. PCT/JP2010/002502 filed on Apr. 6, 2010, designating the United States of America.

BACKGROUND OF THE INVENTION (1) Field of the Invention

The present invention relates to an organic electroluminescent (EL) display device capable of emitting light in multiple colors.

(2) Description of the Related Art

An organic EL display device is a light-emitting display device utilizing electroluminescence of organic compound, and has been in practical use as a small display device used for mobile phones, for example.

The organic EL display device includes organic EL elements arranged on a substrate, and each of the organic EL display elements of a pixel can be individually controlled for light emission. The organic EL display device capable of emitting light in multiple colors includes single-color light-emitting organic EL elements each emits light in different colors (different wavelengths) such as blue, green, or red arranged periodically.

Requirements for the display quality of color display devices including multicolor light-emitting organic EL display device includes high chromatic purity of outgoing light and that images with high contrast can be displayed. Conventionally, various display devices have been developed to accommodate these needs.

Here, high chromatic purity indicates that, in a region in chromaticity coordinates surrounded by a trajectory of single-wavelength light in visible light range, a larger part of the region can be represented.

Contrast indicates a ratio of luminance at a non-light emitting region and a light-emitting region (luminance of light-emitting region divided by luminance of non-light emitting region). When the luminance of the non-light emitting region is high due to reflected external light, the contrast is inherently low, and the display device cannot display a sharp image. On the other hand, when the luminance of the non-light emitting region is low, the contrast is high, and deeper black can be displayed, allowing the display device to display a sharp image.

Patent Literature 1 (Japanese Unexamined Patent Application Publication No. 2003-173875) discloses a multicolor light-emitting organic EL display device with a wavelength selectivity that allows a portion of a wavelength selecting layer (color filter) corresponding to each organic EL element to selectively transmit light in blue, green, or red generated by the organic EL element. A conventional configuration for providing visible light absorbing material on the non-light emitting region between adjacent organic EL elements (referred to as black matrix) may be combined with this configuration.

According to this multicolor organic EL display device, a color filter with a wavelength selecting property suitable for the color of outgoing light increases the chromatic purity of outgoing light from each organic EL element, and the visible-light absorbing material absorbing the external light allows a display of an image with high contrast.

Patent Literature 2 (Japanese Unexamined Patent Application Publication No. 2007-226239) discloses a display filter which absorbs light at a wavelength between the wavelengths of two outgoing light (for example, an intermediate wavelength between blue and green and an intermediate wavelength between green and red) at the entire surface and a plasma display panel using the display filter.

With this display filter, the chromatic purity of the outgoing light increases by an absorption of the light at the intermediate wavelength included in the outgoing light from each light-emitting pixel.

SUMMARY OF THE INVENTION

However, in the multicolor light-emitting organic EL display device according to Patent Literature 1, portions of the color filter positioned with each organic EL element has wavelength selectivity suitable for the color of outgoing light. While this allows obtaining high chromatic purity, there is a problem in manufacturing cost. For example, a process for separately painting four different materials, namely, pigments corresponding to color filters for blue, green, red, and a visible light absorbing material corresponding to the black matrix is necessary. As a result, high cost necessary for manufacturing color filters is unavoidable.

The display filter according to Patent Literature 2 has uniform wavelength selectivity at the entire surface. Thus, it is possible to manufacture the display filter at extremely low cost. However, there is a problem that the display filter is not suitable for an organic EL display device having close peak wavelengths of blue light and green light. Absorbing light at the wavelength intermediate between blue and green light in the organic EL display device absorbs light at a useful wavelength, and causes a problem such as a significant reduction in light-emitting efficiency of green at the price of chromatic purity of blue.

Note that, a configuration without color filters is possible. In this case, there is a problem that the chromatic purity of blue is generally low due to organic EL light-emitting material. In order to solve this problem, it is widely known that the optical cavity can improve the chromatic purity. However, with this method, there is a problem that the change in color depending on viewing angle is generally large. Accordingly, with the configuration without the color filters, it is difficult to achieve high display quality capability.

Furthermore, in order to improve the contrast, a method of reducing the reflectance of external light using a polarizer is widely known. However, the polarizer is generally expensive, which is a big problem in terms of cost. Furthermore, with the polarizer, the transmittance of the light emitted from the inside of the device is low, and thus there is a problem of reduced luminance and increased power consumption.

The present invention has been conceived in view of the problems, and it is an object of the present invention to provide a multicolor light-emitting organic EL display device capable of displaying images with high chromatic purity and contrast, and with a configuration suitable for reducing manufacturing cost.

In order to solve the problems above, the multicolor light-emitting organic EL display device according to the present invention is a multicolor light-emitting organic electroluminescent (EL) display device including a plurality of organic EL light-emitting regions which includes a red-light emitting region which emits red light, a green-light emitting region which emits green light, and a blue-light emitting region which emits blue light and non light-emitting region that are arranged on a main substrate, the organic EL display device including: a first light-adjusting layer including a first portion and a second portion, the first portion selectively transmitting desired blue light, and the second portion absorbing visible light other than at least the desired blue light; and a second light-adjusting layer selectively absorbing light with a wavelength between desired red light and desired green light, in which the blue-light emitting region is overlaid with the first portion, and the non-light emitting portion is overlaid with the second portion, and the organic EL light-emitting regions and the non-light emitting region are overlaid with the second light-adjusting layer.

Here, the first light-adjusting layer includes the openings, and the first portion and the second portion are integrally formed of the same material. The red light-emitting region and the green light-emitting region may be overlaid with the openings, and the second portion may absorb the entire range of visible light.

It is preferable that the multicolor light-emitting organic EL display device includes a light-adjusting layer selectively transmitting red light and that a light-adjusting layer selectively transmitting green light are omitted.

With this configuration, when manufacturing the first light-adjusting layer having the two portions, namely, the first portion and the second portion, the number of patterning process using resist is reduced to less than half, compared to a case where the conventional color filters including four portions, i.e., portions functioning as color filters in three colors and a black matrix are manufactured. Accordingly, the manufacturing cost is reduced to less than half. Since the second light-adjusting layer is implemented as a non-patterned film, the second light-adjusting layer can be manufactured at extremely low cost.

Furthermore, the first light-adjusting layer and the second light-adjusting layer adjust light in a desirable manner. Thus, it is not necessary to further provide a light-adjusting layer which selectively transmits red light, or a light-adjusting layer which selectively transmits green light separately.

The second light-adjusting layer secures chromatic purity of green and red by absorbing light with wavelengths between green and red. The second light-adjusting layer also absorbs external light belonging to the intermediate wavelength (for example, the peak wavelength of the fluorescent light), suppressing the reflectance of the external light and thereby improving the contrast. The first portion of the first light-adjusting layer also contributes to the increase in the contrast by absorbing the external light.

The first portion of the first light-adjusting layer also functions as the color filter for blue, securing the chromatic purity of blue. The second light-adjusting layer selectively absorbs the light with wavelength between green and red. Thus, the light-emitting efficiency of blue is not degraded.

According to the multicolor light-emitting organic EL display device of the present invention, using the first light-adjusting layer having a first portion which is arranged over the blue-light emitting region and functions as a color filter for blue, and the second portion which is arranged over the non-light emitting region and absorbs visible light at least other than blue, and the second light-adjusting layer which selectively absorbs the light at a wavelength between the red light and the green light at an entire surface allows obtaining the chromaticity suitable for outgoing light, the light-emitting efficiency, and the reflectance of external light.

The second portion of the first light-adjusting layer may be integrally made of the same material as the color filter for blue at the first portion. Alternatively, it may be a conventional black matrix.

The first light-adjusting layer is configured of only the color filter for blue or the color filters for blue and the black matrix only. Thus, compared with the conventional color filters configured of the color filters for blue, green and red, and the black matrix, the first light-adjusting layer is more suitable for manufacturing at lower cost. The second light-adjusting layer can be implemented as a non-patterned film. Thus, the second light-adjusting layer can be manufactured at extremely low cost.

Further Information about Technical Background to this Application

The disclosure of Japanese Patent Application No. 2009-095244 filed on Apr. 9, 2009 including specification, drawings and claims is incorporated herein by reference in its entirety.

The disclosure of PCT application No. PCT/JP2010/002502 filed on Apr. 6, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

A multicolor light-emitting organic EL display device according to the present invention (hereafter referred to as an organic EL display device) is a multicolor light-emitting organic electroluminescent (EL) display device including a plurality of organic EL light-emitting regions which emit red light, green light, or blue light and non light-emitting region that are arranged on a main substrate, the organic EL display device including: a first light-adjusting layer including a first portion and a second portion, the first portion selectively transmitting desired blue light, and the second portion absorbing visible light other than at least the desired blue light; and a second light-adjusting layer selectively absorbing light with a wavelength between desired red light and desired green light at an entire surface.

Upon conceiving the present invention, the inventors focus on chromaticity of outgoing light, light-emitting efficiency and reflectance of external light as indicators of display quality capacity of a color organic EL display device. These indicators are determined by an electroluminescence spectrum (EL spectrum) of an organic EL element, and absorption spectrums of the first light-adjusting layer and the second light-adjusting layer.

In terms of color reproducibility, it is preferable that the chromaticity of outgoing light is closer to a chromaticity value indicating a high chromatic purity. In terms of power consumption, higher light-emitting efficiency is preferable. In terms of contrast in bright spot and glare, lower reflectance of external light is preferable.

Furthermore, as a manufacturing cost, the inventors focus on the number of processes for manufacturing the light-adjusting layer.

The smaller number of processes for manufacturing the light-adjusting layer is preferable for reducing the manufacturing cost.

The inventors calculated the chromaticity of the outgoing light, the light-emitting efficiency, and the reflectance of external light based on a number of EL spectrums and absorption spectrums, and after diligent reviews, concluded that the color organic EL device with the configuration described above is capable of displaying images with high chromatic purity and high contrast, and is suitable for reducing the manufacturing cost.

The following shall describe a color organic EL display device according to Embodiment of the present invention with reference to the drawings.

In this Embodiment, the effectiveness and necessity of the present invention shall be described through comparisons of seven different configurations, namely, Examples 1, 2, and comparative examples 1 to 5.

Example 1

Figure 1:
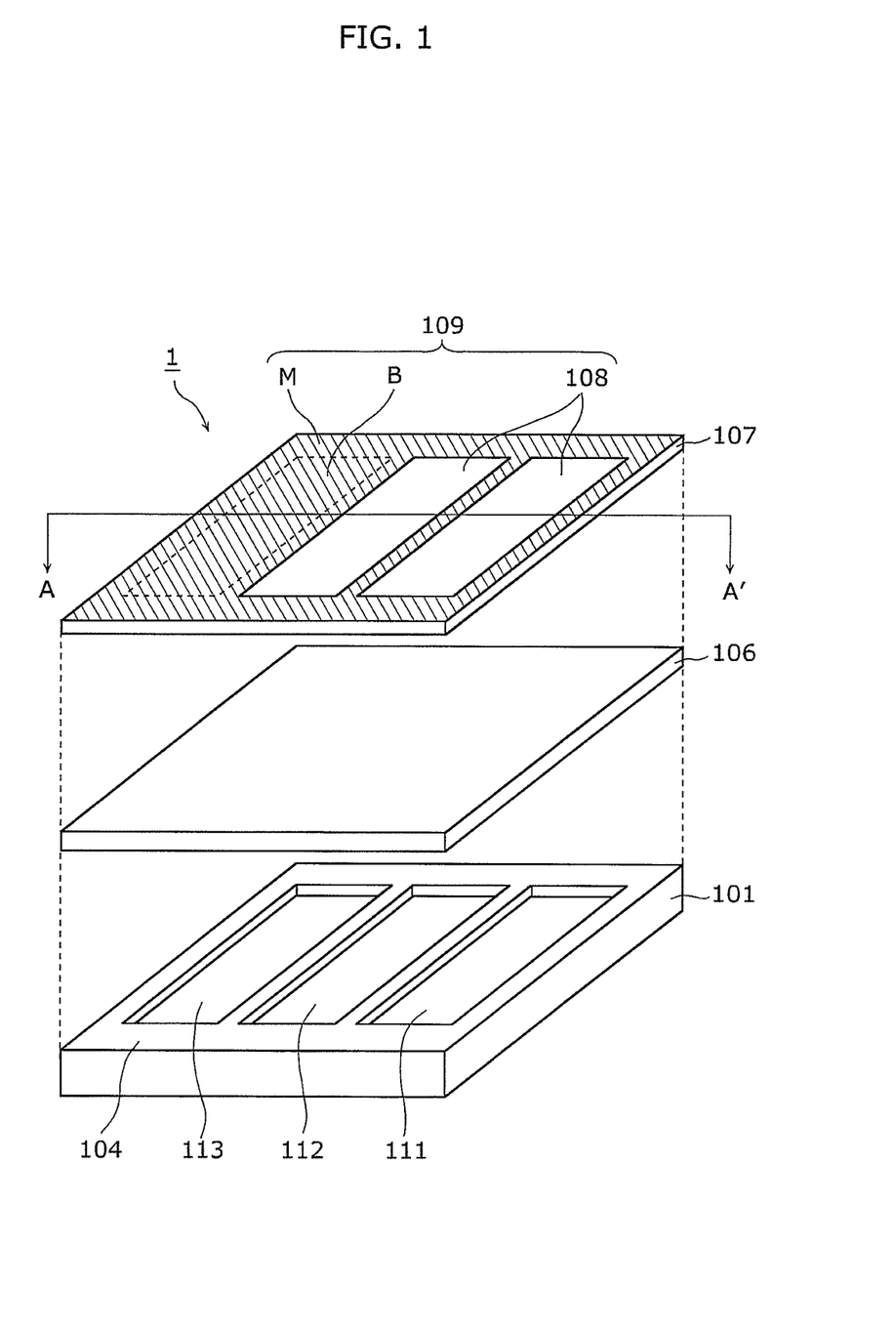
FIG. 1 is an exploded perspective view illustrating schematic configuration of main part of the organic EL display device according Embodiment of the present invention.

FIG. 1 is an exploded perspective view illustrating an example of the configuration of the organic EL display device 1 according to Example 1 of the present invention.

Figure 2:
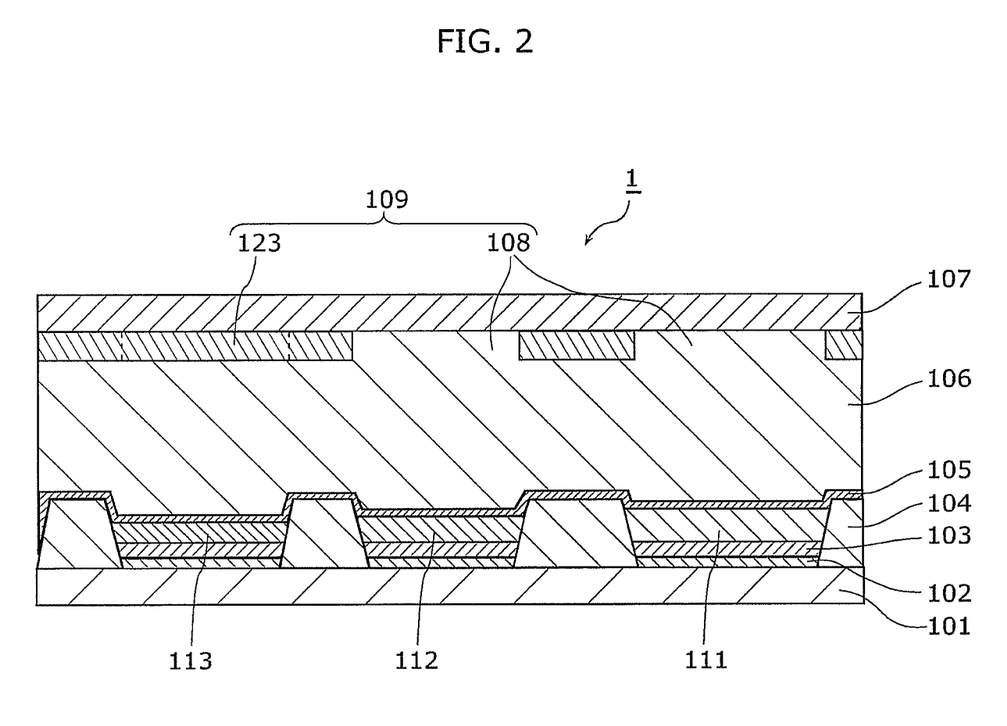
FIG. 2 is a cross-sectional view illustrating schematic configuration of main part of the organic EL display device according Embodiment of the present invention.

FIG. 2 is a cross-sectional view illustrating A-A' cross-section of the organic EL display device 1.

The organic EL display device 1 is configured by bonding a main substrate 101 and a sub substrate 107 using a second light-adjusting layer 106. The main substrate 101 includes a red-light emitting layer 111, a green-light emitting layer 112, and a blue-light emitting layer 113, which are light-emitting regions for red light, green light, and blue light, respectively, and a bank 104 which is a non-light emitting region. A first light-adjusting layer 109 is formed on the sub substrate 107.

The first light-adjusting layer 109 includes a first portion (illustrated as a sign B in FIG. 1) arranged to cover the blue light-emitting layer 113, which is capable of selectively transmitting desired blue light, and a second portion (illustrated as sign M in FIG. 1) arranged to cover the bank 104, which is capable of absorbing visible light other than the desired blue light.

In the organic EL display device 1, as the first portion and the second portion, a blue color filter 123 is integrally formed at a position over the blue-light emitting layer 113 and a position over the bank 104.

The blue color filter 123 is not formed at a position over the red-light emitting layer 111 and a position over the green-light emitting layer 112. With this, the first light-adjusting layer 109 includes an opening 108 arranged over the red-light emitting layer 111 and the green-light emitting layer 112.

Next, with reference to FIG. 2, a method of manufacturing the organic EL display device 1 according to Example of the present invention shall be described.

In this example, the description is made using a top-emission organic EL display device as an example. However, the same effects can be achieved by a bottom-emission organic EL display device.

First, the main substrate 101 is prepared. On the main substrate 101, a driving circuit including a transistor array and others which are conventionally known for an active matrix display device is formed.

Next, a reflexible anode 102 is formed, and is subsequently patterned into a predetermined shape. The material of the anode 102 is not particularly limited, and may be aluminum, silver, chromium, nickel, for example. In terms of light-emitting efficiency, a material with high reflectance can be suitably used. The anode 102 may be a multi-layered structure, and may be a structure including Indium Tin Oxide (ITO) formed on aluminum.

Next, the bank 104 is formed, and patterning is performed such that an upper part of the anode 102 is exposed. The material of the bank 104 is not particularly limited, and an insulating and photosensitive resin is used, for example. The film-forming method and the patterning method are not particularly limited either. For example, after forming the entire surface by a wet process, patterning using the photolithography may be performed.

Next, a hole transport layer 103 is formed. The material for the hole transport layer 103 is not particularly limited. As an example, it may be a small-molecules material, a polymeric material, or a mixture of these materials. In general, Triarylamine derivative is preferably used. Furthermore, the method of forming the hole transport layer 103 is not particularly limited either, and it may be a wet process such as the ink-jet, or a dry process such as the vapor deposition.

Next, the red-light emitting layer 111, the green-light emitting layer 112, and the blue-light emitting layer 113 are formed. The luminescent material used for the red-light emitting layer 111, the green-light emitting layer 112, and the blue-light emitting layer 113 may be a small-molecules material, a polymeric material, or the mixture of these materials. It is necessary for the luminescent materials to emit light with a chromaticity relatively close to a preferred chromaticity of the outgoing light. The generated spectrum from the luminescent materials and the chromaticity of the outgoing light after a color correction by the light-adjusting layer shall be described later in detail.

Next, the cathode 105 is formed. The cathode 105 has an electron injecting property, and can also serve as an electron injecting layer. Although the structure of the cathode 105 is not particularly limited, it is necessary for the cathode 105 to have a relatively high transmittance of visible light when the organic EL display device is of the top-emission type. For example, a stacked structure of Lithium Fluoride, Magnesium, and an alloy of Silver may be used.

Individual from the manufacturing process described above, the sub substrate 107 having the first light-adjusting layer 109 is manufactured. The sub substrate 107 is, for example, a glass substrate.

The first light-adjusting layer 109 includes a first portion and a second portion. The first portion selectively transmits the desired blue light, and the second portion absorbs at least visible light other then the desired blue light, and is a blue color filter 123 made of the same material integrally formed to cover the blue-light emitting layer 113 and the non-light emitting region. Here, the non-light emitting region is where the bank 104 exists, and does not emit any light since the region is electrically insulated.

The blue color filter 123 increases the purity of blue color by selectively transmitting the desired blue light included in the light emitted from the blue-light emitting layer 113. Furthermore, the blue color filter 123 improves the contrast of the displayed image by absorbing, on the bank 104; the visible light other then the desired blue light included in the external light.

Although the material of the blue color filter 123 is not particularly limited, a resin including dispersed pigment or dye may be preferably used. The absorption spectrum of the blue color filter 123 is important, and the relationship with the light-emission spectrum shall be described later in detail.

Although a method of manufacturing the blue color filter 123 and the black matrix 124 on the sub substrate 107 is not particularly limited, one possible method is a photolithography using photosensitive resin with dispersed pigment, for example.

Finally, the sub substrate 107 supporting the first light-adjusting layer 109 and the main substrate 101 supporting the organic EL light-emitting region are bonded by the second light-adjusting layer 106.

Although the method of bonding is not particularly limited, for example, the pigments are dispersed in photo-curable resin, and the main substrate 101 and the sub substrate 107 are bonded by the resin. After that, the resin is fixed by irradiating light. Note that, as illustrated in FIG. 2, it is necessary to position the second portion of the blue color filter 123 and the bank 104 to correspond to each other.

The absorption spectrum of the second light-adjusting layer 106 is important, and it is necessary for the second light-adjusting layer 106 to selectively absorb light with a wavelength between the desired red light and the desired green light. As an example, the second light-adjusting layer 106 may have an absorption spectrum having a local maximum absorptance at a wavelength between 600 nm and 520 nm. The relationship between the absorption spectrum and the chromaticity of outgoing light shall be described later in detail.

Example 2

Figure 3:
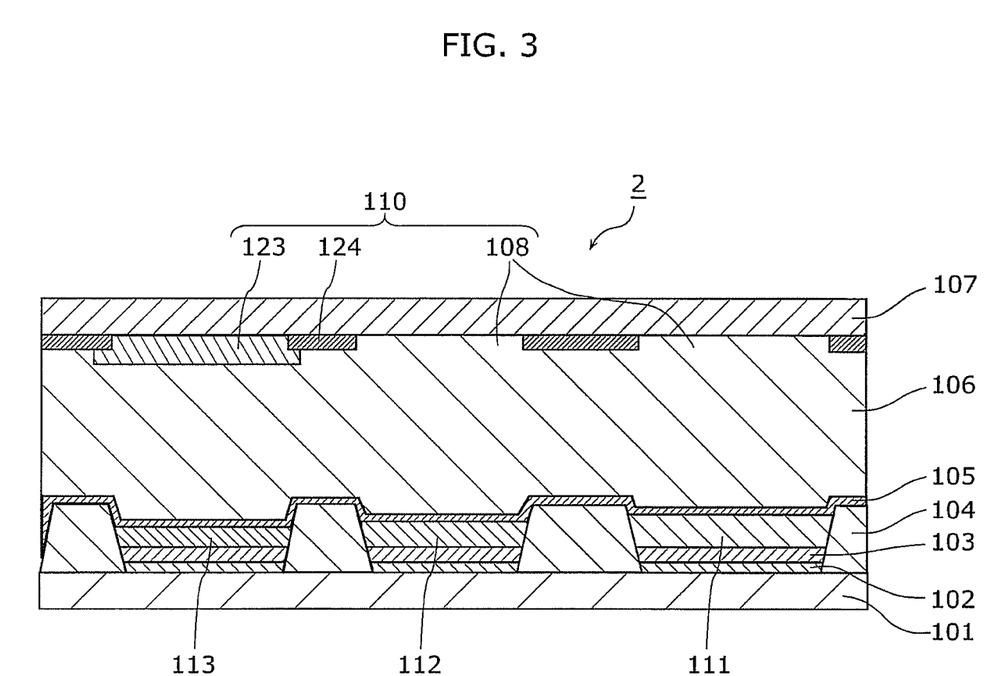
FIG. 3 is a cross-sectional view illustrating schematic configuration of main part of the organic EL display device according Embodiment of the present invention.

In Example 2, compared with Example 1, the method of forming the organic EL luminescent region is identical, but the configuration of the first light-adjusting layer 110 is different.

FIG. 3 is a cross-sectional view illustrating an example of configuration of the organic EL display device 2 according to Example 2, and corresponds to the A-A' cross section of the organic EL display device 1 in FIG. 2. The first light-adjusting layer 110 in the organic EL display device 2 is manufactured as follows.

Independent from the process for manufacturing the organic EL light-emitting region on the main substrate 101, the sub substrate 107 having the first light-adjusting layer 110 is manufactured. The sub substrate 107 is, for example, a glass substrate.

The first light-adjusting layer 110 includes the blue color filter 123 positioned with the blue-light emitting layer 113, and is the first portion that selectively transmits the desired blue light, and the black matrix 124 positioned with the non-light emitting region, and is the second portion that selectively absorbs the entire visible light range. Here, the non-light emitting region is where the bank 104 exists, and does not emit any light since the region is electrically insulated.

The blue color filter 123 and the black matrix 124 are not formed at a position over the red-light emitting layer 111 and a position over the green-light emitting layer 112. With this, the first light-adjusting layer 110 includes an opening 108 positioned to cover the red-light emitting layer 111 and the green-light emitting layer 112.

The blue color filter 123 increases the purity of blue color by selectively transmitting the predetermined blue light included in the light emitted from the blue-light emitting layer 113. Although the material of the blue color filter 123 is not particularly limited, a resin including dispersed pigment or dye may be preferably used. The absorption spectrum of the blue color filter 123 is important, and the relationship with the light-emission spectrum shall be described later in detail.

The black matrix 124 has an absorptance of 90% or higher (preferably almost 100%) in the entire visible light range, and improves the contrast of display image by absorbing external light. Although the material of the black matrix 124 is not particularly limited, a resin with dispersed pigment or dye may be preferably used.

Although a method of manufacturing the blue color filter 123 and the black matrix 124 on the sub substrate 107 is not particularly limited, one possible method is a photolithography using photosensitive resin with dispersed pigment, for example.

Finally, the sub substrate 107 supporting the first light-adjusting layer 110 and the main substrate 101 supporting the organic EL light-emitting region are bonded by the second light-adjusting layer 106.

Although the method of bonding is not particularly limited, for example, the pigments are dispersed in photo-curable resin, and the main substrate 101 and the sub substrate 107 are bonded by the resin. After that, the resin is fixed by irradiating light. Note that, as illustrated in FIG. 3, it is necessary to position the black matrix 124 and the bank 104 to correspond to each other.

The following is the description for comparative examples 1 to 5. For comparison with Examples 1 and 2, the comparative examples 1 to 5 are configured by changing part of Examples 1 and 2.

Comparative Example 1

An organic EL display device is manufactured in the same manner as Example 1 except that the second light-adjusting layer 109 and the second light-adjusting layer 106 are omitted.

Comparative Example 2

An organic EL display device is manufactured in the same manner as Example 1 except that the second light-adjusting layer 106 is omitted.

Comparative Example 3

An organic EL display device is manufactured in the same manner as Example 1 except that the first light-adjusting layer 109 is omitted.

Comparative Example 4

An organic EL display device is manufactured in the same manner as Example 2 except that a black matrix is not provided in the first light-adjusting layer 110.

Comparative Example 5

An organic EL display device is manufactured in the same manner as Example 2 except that, in addition to the blue color filter and the black matrix in Example 2, a green color filter positioned with the green-light emitting layer is provided, and a red color filter positioned with the red-light emitting layer is provided as the first light-emitting layer 110, and that the second light-adjusting layer 106 is omitted.

Next, spectrums used for basis of consideration shall be described.

Figure 4:
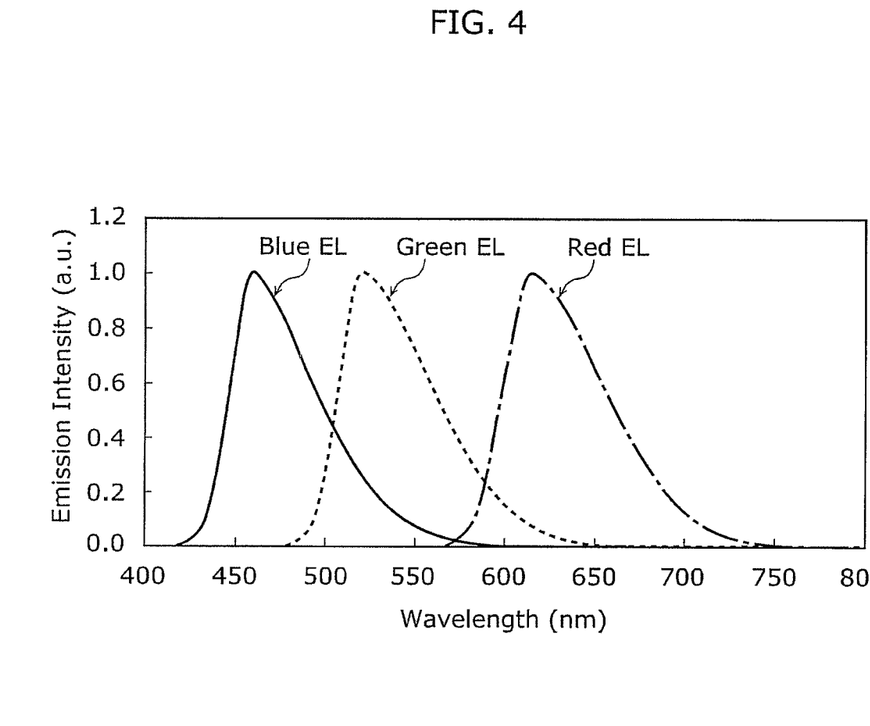
FIG. 4 is a graph illustrating EL spectrums of red, green, and blue used for examples and comparative examples.

FIG. 4 is a graph illustrating spectrums of light emitted by red, green, and blue luminescent materials (hereafter referred to as EL spectrums) used for Examples 1 and 2, and the comparative examples 1 to 5. These are spectrums before transmitting through the first light-adjusting layer 109, the first light-adjusting layer 110, and the second light-adjusting layer 106.

These spectrums are typical as a shape of spectrums of light emitted from the organic EL, and are reproduced by using a function similar to the normal distribution function.

Figure 5:
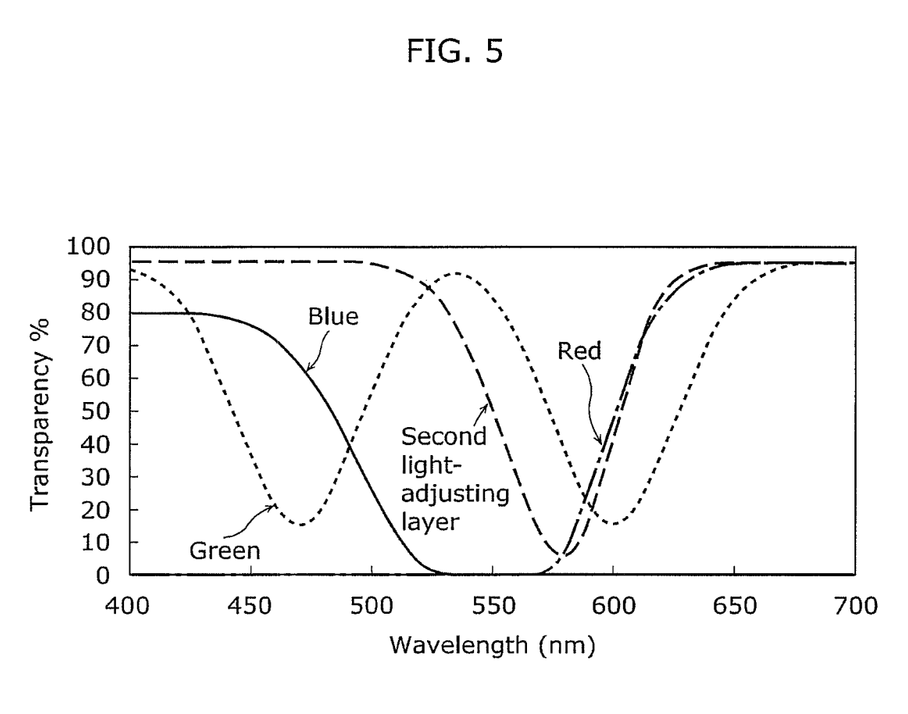
FIG. 5 is a graph illustrating absorption spectrum of a first light-adjusting layer or a second light-adjusting layer used for the examples and the comparative examples.

FIG. 5 is a graph illustrating the absorption spectrums of red, green, and blue by the blue color filter 123 in the first light-adjusting layer 109 and the first light-adjusting layer 110, and the absorption spectrum of the second light-adjusting layer 106 used in Examples 1 and 2, and the comparative examples 1 to 5. These are typical as shape of the absorption spectrums of color filters for LCD or the organic EL display device, and are reproduced by using a function similar to the normal distribution function.

Figure 6:
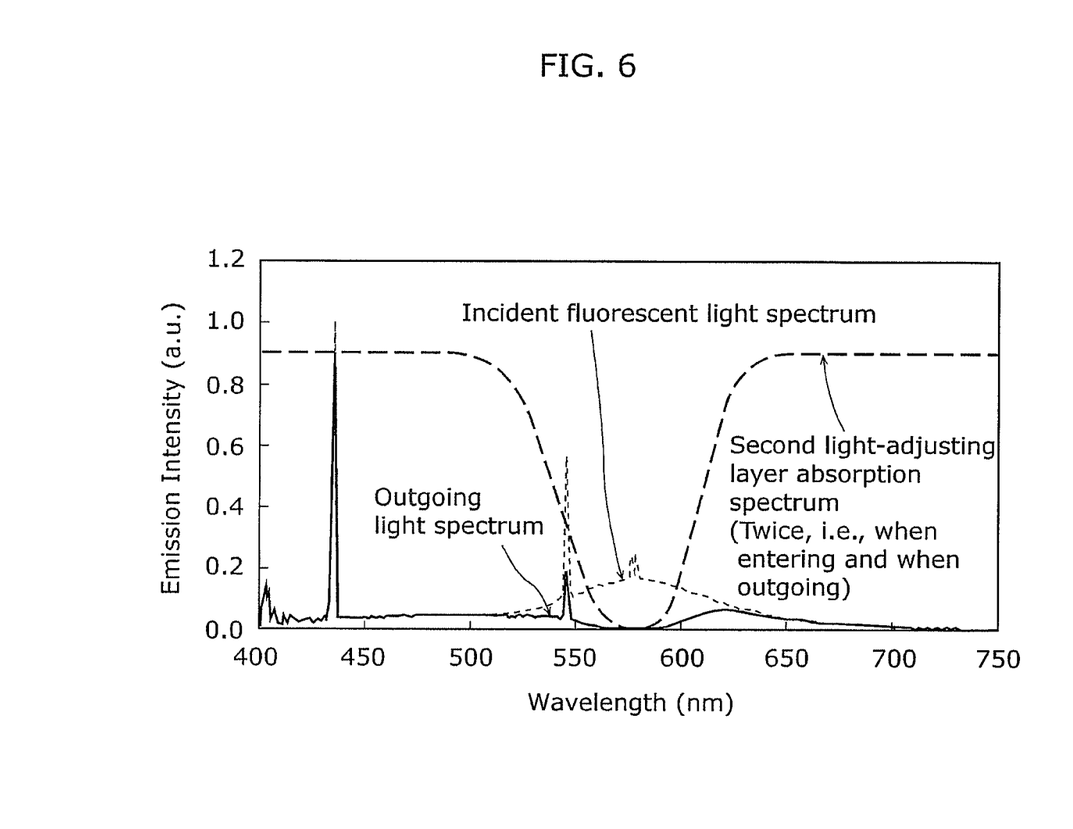
FIG. 6 is a graph illustrating a spectrum of fluorescent light for calculating reflectance of external light, the absorption spectrum when the light passes the second light-adjusting layer twice, and a spectrum of fluorescent light after the transmission used for the examples and the comparative examples.

FIG. 6 is a graph illustrating spectrums of fluorescent light used for calculating the reflectance of external light in Examples 1 and 2, and the comparative examples 1 to 5. For reference, the absorption spectrum when the light transmits the second light-adjusting layer 106 twice, and the spectrum of the fluorescent light are illustrated together.

Using these spectrums as a basis, the chromaticity of the outgoing light in red, green, and blue, a luminance ratio of red, green, and blue outgoing light (assuming that the comparative example 1 is 100%), and the reflectance of external light (assuming that the comparative example 1 is 100%) in Examples and the comparative examples 1 to 5 are calculated.

Table 1 indicates the calculation results, configuration, and the number of processes necessary for forming the light-adjusting layers with regard to Examples 1, 2, and the comparative examples 1 to 5.

| Configuration* | Chromaticity (CIE color coordinates) | | | Luminance ratio (%) | | | Reflectance of external light (%) | Number of film-forming processes |
|---|---|---|---|---|---|---|---|---|
| | Red | Green | Blue | Red | Green | Blue | | |
| Example 1 B, Second light-adjusting layer | (0.686, 0.313) | (0.221, 0.706) | (0.130, 0.079) | 65 | 58 | 27 | 12 | Color resist × 1 Non-patterned film × 1 |
| Example 2 B, BM, Second light-adjusting layer | (0.686, 0.313) | (0.221, 0.706) | (0.130, 0.079) | 65 | 58 | 27 | 9 | Color resist × 2 Non-patterned film × 1 |
| Comparative Example 1 No light-adjusting layer | (0.669, 0.331) | (0.303, 0.652) | (0.135, 0.170) | 100 | 100 | 100 | 100 | None |
| Comparative Example 2 B, BM | (0.669, 0.331) | (0.303, 0.652) | (0.130, 0.079) | 100 | 100 | 29 | 33 | Color resist × 2 |
| Comparative Example 3 Second light-adjusting layer | (0.686, 0.313) | (0.221, 0.706) | (0.127, 0.153) | 65 | 58 | 82 | 28 | Non-patterned film × 1 |
| Comparative Example 4 B, Second light-adjusting layer | (0.686, 0.313) | (0.221, 0.706) | (0.130, 0.079) | 65 | 58 | 27 | 23 | Color resist × 1 Non-patterned film × 1 |
| Comparative Example 5 R, G, B, BM | (0.684, 0.316) | (0.254, 0.700) | (0.130, 0.080) | 66 | 74 | 29 | 8 | Color resist × 4 |

*R, G, B: Red, Green, Blue color filter, BM: Black Matrix All formed as the first light-adjusting layer Here, the spectrum after transmitting the light-adjusting layer is calculated by multiplying the absorption spectrum of the light-adjusting layer with the EL spectrum described above.

The chromaticity is calculated from the spectrum after transmitting the light-adjusting layer.

The luminance ratio is calculated by an area ratio of spectrums after transmitting the light-adjusting layer (in consideration with the luminosity curve).

The reflectance of external light is calculated from an area ratio of the spectrum obtained from the spectrum of the fluorescent light in FIG. 6 transmitting the light-adjusting layer twice, namely, when entering and outgoing the light-adjusting layer (in consideration with the luminosity curve).

Note that, these calculation results are separately confirmed to be effective values highly matching actually measured values.

With reference to Table 1, a comparison between the comparative example 1 and Example 1 and Example 2 shows the following.

In Examples 1 and 2, the chromaticity of all colors, red, blue, and green is improved. In particular, the chromaticity of blue significantly improved, entering a range sufficient for practical use. The chromaticity of blue is improved by the blue color filter positioned with the blue pixel, and the chromaticity of green and red is improved by the second light-adjusting layer 106.

Furthermore, the reflectance of external light is significantly reduced. The reflectance of external light is improved by absorption of external light by the second light-adjusting layer 106 and the first light-adjusting layer 109 or the first light-adjusting layer 110.

Accordingly, the first light-adjusting layer 109, the first light-adjusting layer 110, and the second light-adjusting layer 106 significantly contribute to the improvement in the chromaticity and the reflection of external light.

Furthermore, the comparison between the comparative example 2 and Examples 1 and 2 shows the following.

In Examples 1 and 2, the chromaticity of red and green is improved. This is based on the color correction by the second light-adjusting layer 106.

Furthermore, in Examples 1 and 2, the reflectance of external light improved. This is improved by the absorption of external light by the second light-adjusting layer 106.

As described above, using the second light-adjusting layer 106 improves the chromaticity of green and red, and the reflectance of external light.

Furthermore, the comparison between the comparative example 3 and Examples 1 and 2 shows the following.

In Examples 1 and 2, the chromaticity of blue and the reflectance of external light is improved. This is because; the chromaticity of blue is improved by the first portion transmitting blue light in the first light-adjusting layer 109 or the first light-adjusting layer 110.

The reflectance of external light is also improved. This is because, in Example 1, the external light is absorbed by the second portion in the first light-adjusting layer 109, which absorbs visible light other than blue. In Example 2, the black matrix 124 is formed positioned with the non-light emitting region. Therefore, the reflection of external light is suppressed further.

Accordingly, the first light-adjusting layer 109 and the first light-adjusting layer 110 are important for improving the chromaticity of blue, and for improving the reflectance of external light.

Furthermore, the comparison between the comparative example 4 and Examples 1 and 2 shows the following.

In Examples 1 and 2, the reflectance of external light is improved. This is because, the external light on the bank 104 is absorbed by the second portion of the first light-adjusting layer 109, which absorbs visible light other than blue, or the black matrix 124.

Accordingly, the second portion of the first light-adjusting layer 109 which absorbs visible light other than blue and the black matrix 124 are important for improving the reflectance of external light.

Furthermore, the comparison between the comparative example 5 and Examples 1 and 2 shows the following.

Although the chromaticity, a ratio of luminance of emitted light, and the reflectance of external light are in the same range, Examples 1 and 2 have fewer manufacturing processes.

The process for forming the second light-adjusting layer 106 as non-patterned film is significantly inexpensive compared to the process for forming color filters in three colors and a black matrix. Accordingly, the cost for manufacturing the color filter unit in Examples is less than half in Example 1 and is approximately half in Example 2, compared to the comparative example 5.

In conclusion, according to the organic EL display device according to Examples of the present invention, it is possible to maintain capacity such as chromaticity, luminance ratio, and the reflectance of external light equivalent to the conventional color filters in three colors and the black matrix, and to reduce the cost for manufacturing color filters to less than half.

Furthermore, the results of numerous calculations using other EL spectrums and absorption spectrums of the light-adjusting layers confirm that the conclusion above is still applicable even when the shape of spectrums (position of peak wavelength, half bandwidth, and spread of the end of spectrum) is slightly changed.

Although only some exemplary embodiments of the organic EL display device according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The organic EL display device according to the present invention is particularly applicable to large-screen active-matrix display devices combined with thin film transistors capable of emitting light in multiple colors, and is applicable to any display device such as televisions and personal computers.

What is claimed is:

1. A multicolor light-emitting organic electroluminescent (EL) display device including a plurality of organic EL light-emitting regions which include a red-light emitting region which emits red light, a green-light emitting region which emits green light, a blue-light emitting region which emits blue light, and a non light-emitting region arranged on a main substrate, said organic EL display device comprising:
    a first light-adjusting layer including a first portion and a second portion, the first portion selectively transmitting desired blue light and overlaying the blue-light emitting region, and the second portion absorbing visible light other than the desired blue light and overlaying the non-light emitting portion; and
    a second light-adjusting layer selectively absorbing light with a wavelength between desired red light and desired green light and overlaying the red-light emitting region, the green-light emitting region, the blue-light emitting region and the non-light emitting region,
    wherein a light-adjusting layer selectively transmitting red light, and a light-adjusting layer selectively transmitting green light are omitted from the organic EL display device entirely.

2. A multicolor light-emitting organic electroluminescent (EL) display device including a plurality of organic EL light-emitting regions which include a red-light emitting region which emits red light, a green-light emitting region which emits green light, a blue-light emitting region which emits blue light, and a non light-emitting region arranged on a main substrate, said organic EL display device comprising:
    a first light-adjusting layer including a first portion and a second portion, the first portion selectively transmitting desired blue light and overlaying the blue-light emitting region, and the second portion absorbing visible light other than the desired blue light and overlaying the non-light emitting portion; and
    a second light-adjusting layer selectively absorbing light with a wavelength between desired red light and desired green light and overlaying the red-light emitting region, the green-light emitting region, the blue-light emitting region and the non-light emitting region, wherein the red-light emitting region has a red luminescent material, the green-light emitting region has a green luminescent material, and the blue-light emitting region has a blue luminescent material.

3. A multicolor light-emitting organic electroluminescent (EL) display device including a plurality of organic EL light-emitting regions which include a red-light emitting region which emits red light, a green-light emitting region which emits green light, a blue-light emitting region which emits blue light, and a non light-emitting region arranged on a main substrate, said organic EL display device comprising:

a first light-adjusting layer comprising a material selectively transmitting desired blue light and absorbing visible light other than the desired blue light, and including a first portion and a second portion, the first portion overlaying the blue-light emitting region, the second portion overlaying the non-light emitting portion, and the first portion and the second portion are integrally formed; and a second light-adjusting layer selectively absorbing light with a wavelength between desired red light and desired green light and overlaying the red-light emitting region, the green-light emitting region, the blue-light emitting region and the non-light emitting region, wherein the first light-adjusting layer has a plurality of openings and each of the plurality of openings is overlaying the red light-emitting region or the green light-emitting region.

4. The multicolor light-emitting organic EL display device according to claim 1, wherein the first light-adjusting layer has a plurality of openings, and the first portion and the second portion are integrally formed of a same material, and the red light-emitting region and the green light-emitting region are overlaid with the openings.

5. The multicolor light-emitting organic EL display device according to claim 1, wherein the second portion absorbs an entire range of visible light.

6. The multicolor light-emitting organic EL display device according to claim 1, wherein the first light-adjusting layer is formed on a sub substrate which is separate from the main substrate, and the main substrate and the sub substrate are bonded such that the first light-adjusting layer and the organic EL light-emitting regions face each other.

7. The multicolor light-emitting organic EL display device according to claim 6, wherein the organic EL light-emitting regions, the second light-adjusting layer, and the first light-adjusting layer are arranged in this order in a thickness direction of the multicolor light-emitting organic EL display device.

8. The multicolor light-emitting organic EL display device according to claim 7, wherein the first light-adjusting layer and the second light-adjusting layer are formed in this order on the sub substrate which is distinct from the main substrate, and the main substrate and the sub substrate are bonded such that the second light-adjusting layer and the organic EL light-emitting regions face each other.

9. The multicolor light-emitting organic EL display device according to claim 6, wherein the main substrate and the sub substrate are bonded by a colored resin layer, and the colored resin layer functions as the second light-adjusting layer.

10. The multicolor light-emitting organic EL display device according to claim 2, wherein the first light-adjusting layer has a plurality of openings, and the first portion and the second portion are integrally formed of a same material, and the red light-emitting region and the green light-emitting region are overlaid with the openings.

11. The multicolor light-emitting organic EL display device according to claim 2, wherein a light-adjusting layer selectively transmitting red light and a light-adjusting layer selectively transmitting green light are omitted.

12. The multicolor light-emitting organic EL display device according to claim 2, wherein the second portion absorbs an entire range of visible light.

13. The multicolor light-emitting organic EL display device according to claim 2, wherein the first light-adjusting layer is formed on a sub substrate which is separate from the main substrate, and the main substrate and the sub substrate are bonded such that the first light-adjusting layer and the organic EL light-emitting regions face each other.

14. The multicolor light-emitting organic EL display device according to claim 13, wherein the organic EL light-emitting regions, the second light-adjusting layer, and the first light-adjusting layer are arranged in this order in a thickness direction of the multicolor light-emitting organic EL display device.

15. The multicolor light-emitting organic EL display device according to claim 14, wherein the first light-adjusting layer and the second light-adjusting layer are formed in this order on the sub substrate which is distinct from the main substrate, and the main substrate and the sub substrate are bonded such that the second light-adjusting layer and the organic EL light-emitting regions face each other.

16. The multicolor light-emitting organic EL display device according to claim 13, wherein the main substrate and the sub substrate are bonded by a colored resin layer, and the colored resin layer functions as the second light-adjusting layer.

17. The multicolor light-emitting organic EL display device according to claim 3, wherein a light-adjusting layer selectively transmitting red light and a light-adjusting layer selectively transmitting green light are omitted.

18. The multicolor light-emitting organic EL display device according to claim 3, wherein the first light-adjusting layer is formed on a sub substrate which is separate from the main substrate, and the main substrate and the sub substrate are bonded such that the first light-adjusting layer and the organic EL light-emitting regions face each other.

19. The multicolor light-emitting organic EL display device according to claim 18, wherein the organic EL light-emitting regions, the second light-adjusting layer, and the first light-adjusting layer are arranged in this order in a thickness direction of the multicolor light-emitting organic EL display device.

20. The multicolor light-emitting organic EL display device according to claim 19, wherein the first light-adjusting layer and the second light-adjusting layer are formed in this order on the sub substrate which is distinct from the main substrate, and the main substrate and the sub substrate are bonded such that the second light-adjusting layer and the organic EL light-emitting regions face each other.

21. The multicolor light-emitting organic EL display device according to claim 18, wherein the main substrate and the sub substrate are bonded by a colored resin layer, and the colored resin layer functions as the second light-adjusting layer.

* * * * *